US009826660B2

(12) United States Patent
Rodriguez et al.

(10) Patent No.: US 9,826,660 B2
(45) Date of Patent: *Nov. 21, 2017

(54) DATA CENTER COOLING ARRANGEMENTS

(71) Applicant: International Business Machines Corporation, Armonk, NY (US)

(72) Inventors: Jean-Michel Rodriguez, Montpellier (FR); Emmanuel Tong-Viet, Montpellier (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/437,506

(22) Filed: Feb. 21, 2017

(65) Prior Publication Data

US 2017/0172010 A1   Jun. 15, 2017

Related U.S. Application Data

(63) Continuation of application No. 14/037,770, filed on Sep. 26, 2013, now Pat. No. 9,661,782, which is a
(Continued)

(30) Foreign Application Priority Data

Mar. 30, 2012   (EP) .................... 12305379

(51) Int. Cl.
*H05K 5/00* (2006.01)
*H05K 7/20* (2006.01)
(Continued)

(52) U.S. Cl.
CPC ..... *H05K 7/20145* (2013.01); *H05K 7/20172* (2013.01); *G06F 1/20* (2013.01);
(Continued)

(58) Field of Classification Search
CPC .. H01K 5/0213; H01K 7/1461; H01K 7/1481; H01K 7/1489; H01K 7/20172; H01K 7/20581
(Continued)

(56) References Cited

U.S. PATENT DOCUMENTS 5,388,032 A   2/1995   Gill et al.
6,801,428 B2   10/2004   Smith et al.
(Continued)

FOREIGN PATENT DOCUMENTS

EP       2252136 A2   11/2010

OTHER PUBLICATIONS

Office Action for U.S. Appl. No. 13/684,751 dated Jul. 7, 2015; 24 pages.
(Continued)

*Primary Examiner* — Avinash Savani
*Assistant Examiner* — Vivek Shirsat
(74) *Attorney, Agent, or Firm* — Daniel Simek; Hoffman Warnick LLC

(57) ABSTRACT

A rack system for mounting at least one data processing unit includes a shelf operable for moving from a position internally of the rack system to a position externally of the rack system. The shelf has an aperture and a fluid mover for moving fluid through the aperture in the shelf when the shelf is located in its external position.

15 Claims, 4 Drawing Sheets

Related U.S. Application Data continuation of application No. 13/684,751, filed on Nov. 26, 2012.

(51) Int. Cl.
    *G06F 1/20*           (2006.01)
    *H05K 7/14*          (2006.01)

(52) U.S. Cl.
    CPC .............. *H05K 7/1497* (2013.01); *H05K 7/20* (2013.01); *H05K 7/20727* (2013.01)

(58) Field of Classification Search
    USPC ................ 454/184; 361/727, 679.05, 679.08
    See application file for complete search history.

(56) References Cited

U.S. PATENT DOCUMENTS

| | | |
|---|---|---|
| 7,403,390 B2 | 7/2008 | Franz et al. |
| 8,089,754 B2 | 1/2012 | Peng et al. |
| 2002/0173267 A1 | 11/2002 | Sharp et al. |
| 2008/0274685 A1 | 11/2008 | DeJonge et al. |
| 2010/0110633 A1 | 5/2010 | Gigushinsky |
| 2011/0026221 A1 | 2/2011 | Joshi |
| 2011/0105010 A1 | 5/2011 | Day |
| 2013/0260666 A1 | 10/2013 | Rodriquez et al. |
| 2014/0030975 A1 | 1/2014 | Rodriquez et al. |

OTHER PUBLICATIONS

Office Action for U.S. Appl. No. 13/684,751 dated Sep. 23, 2015; 12 pages.

Office Action for U.S. Appl. No. 13/684,751 dated Feb. 10, 2016; 12 pages.

Office Action for U.S. Appl. No. 13/684,751 dated Aug. 11, 2016; 11 pages.

IBL Parts Ltd.; IBL Parts for Server Cabinets, Server Racks, KVM Consoles & Rack Mount Accessories; Nov. 26, 2012; 1 Page.

Office Action for U.S. Appl. No. 14/037,770 dated Sep. 8, 2016; 40 Pages.

Office Action for U.S. Appl. No. 14/037,770 dated Oct. 20, 2016; 24 Pages.

Notice of Allowance and Fee(s) Due for U.S. Appl. No. 14/037,770 dated Jan. 18, 2017; 28 Pages.

DATA CENTER COOLING ARRANGEMENTS

TECHNICAL FIELD

The present invention relates to the field of data center cooling. More particularly, it relates to the enhancement of cooling air flow to the machines in a data center.

RELATED ART

The growth of computer networking, and particularly the rapid growth of the use of the Internet, has resulted in a rapid increase in demand for server computers. Most commonly, a number of modular server units, for example the modular computing units known as "blade" servers, are removably mounted in equipment racks. Typically a large number of such racks are housed in a building known as a data center. In a data center, one or more large rooms are provided. Each room houses rows of equipment racks and their mounted servers, and associated cabling and network communication equipment.

A modern rack when fully loaded with blade servers consumes a large amount of electrical power when operating. In consequence, a large amount of waste heat is produced. Many data centers now employ individual racks of blade servers in which each rack develops 20 kW or more of waste heat. To avoid damage to the servers by overheating, this waste heat must be removed.

In a commonly used arrangement, data center rooms are cooled by computer room air conditioning units (termed CRACs) which circulate cooled air which passes through the rack units for heat removal. Typically, a data center room comprises a raised floor above a plenum chamber through which cooled air is blown by CRAC units. Rows of server racks are mounted on the floor separated by aisles. Networks of grilles in the floors of the aisles between rows of server racks allow cooled air from the plenum to rise into the aisles. From here it is typically drawn through the front of the racks by fans mounted in the racks. Heated air passes out of the other side of the rack and is drawn up into a roof plenum chamber for removal or recirculation through the CRAC units. In a commonly used arrangement, an aisle comprises two rows of server racks whose fronts face each other with the floor of the aisle space between the two rows of server racks comprising a number of grilles through which cooled air rises. This is termed a cold aisle. Behind each row of racks is a hot aisle to which heated air passes after flowing through the racks and then rises for removal by way of the roof plenum chamber.

Maintaining the free flow of cooling air is vital for maintaining the temperatures of all the blade servers within acceptable operational limits. However, there are times when the introduction of obstructions into aisles is unavoidable. For example, it is sometimes necessary to provide a shelf for the support of a keyboard and display of a server unit installed for the purpose of performing hardware management operations on the other installed servers. This is known as a hardware management console or HMC. The shelf is typically installed in a horizontal rack slot at a height convenient for use by a maintenance operator. The shelf runs on rails so that it may be pulled out from the front of the rack to form a horizontal management operations shelf. It includes a horizontal keyboard and behind this a flat screen display. The display is horizontal when in a stored position in the rack but moveable to a near vertical position to provide a display interface to the HMC when the shelf is withdrawn from the rack into an operating position.

During operation of the HMC, the shelf extending from the rack front forms a barrier to vertically rising cooling air in the cold aisle. The supply of cooling air is an energy intensive operation. It is therefore desirable to optimize the supply of cooling air to provide just enough to maintain efficient server operation at every position in the rack. Any obstruction of flow by a shelf will restrict the supply of cooling air supply to blade servers in the rack above the shelf. This is likely therefore to result in the overheating of these blade servers. It would be desirable to provide a solution to the problem of restricted air flow resulting from the use of a shelf protruding from the front of a rack, such as when using a HMC.

U.S. Pat. No. 6,801,428 discloses an arrangement for cooling a series of closely spaced upright computer components mounted to a support, the arrangement including a tray having a plurality of air moving devices such as fans. Members are used for helping removably mount the tray to the support in a generally horizontal disposition, and the air moving devices move air in a generally upright path of travel to help cool the upright computer components. The tray also has a series of connector ports for connecting electrically to outputs from individual ones of the computer components.

SUMMARY OF THE INVENTION

Viewed from a first aspect, the invention provides a rack system for mounting at least one data processing unit, the rack system comprising a shelf operable for moving from a position internally of the rack system to a position externally of the rack system. The shelf comprises an aperture in the shelf and a fluid mover for moving fluid through the aperture in the shelf when the shelf is located in its external position.

In an embodiment of the rack system, the fluid mover is an air mover.

In an embodiment of the rack system, the shelf is mounted on rails operable for moving the shelf from the position internally of the rack system to the position externally of the rack system.

In an embodiment of the rack system, the air mover is operable for moving air from below the shelf.

In an embodiment of the rack system, the air mover comprises at least one fan.

In an embodiment of the rack system, the external position is an operating position of the shelf.

In an embodiment of the rack system, the shelf comprises a hardware management console.

Viewed from a second aspect, the invention provides a shelf for mounting in a rack system, the rack system for mounting at least one data processing unit, the shelf being operable for moving from a position internally of the rack system to a position externally of the rack system. The shelf comprises an aperture in the shelf and a fluid mover for moving fluid through the aperture in the shelf when the shelf is located in its external position.

In an embodiment of the shelf, the fluid mover is an air mover.

In an embodiment of the shelf, the shelf is mounted on rails operable for moving the shelf from the position internally of the rack system to the position externally of the rack system.

In an embodiment of the shelf, the air mover is operable for moving air from below the shelf.

In an embodiment of the shelf, the air mover comprises at least one fan.

In an embodiment of the shelf, the external position is an operating position of the shelf.

In an embodiment of the shelf, the shelf comprises a hardware management console.

Viewed from a third aspect, the invention provides a method for supplying cooling fluid to a rack system, the rack system for mounting at least one data processing unit, the method comprising providing a shelf operable for moving from a position internally of the rack system to a position externally of the rack system. The shelf comprises an aperture in the shelf and a fluid mover for moving fluid through the aperture in the shelf when the shelf is located in its external position.

In an embodiment of the method, the fluid mover is an air mover.

In an embodiment of the method, the shelf is mounted on rails operable for moving the shelf from the position internally of the rack system to the position externally of the rack system.

In an embodiment of the method, the air mover is operable for moving air from below the shelf.

In an embodiment of the method, the air mover comprises at least one fan.

In an embodiment of the method, the external position is an operating position of the shelf.

In an embodiment of the method, the shelf comprises a hardware management console.

BRIEF DESCRIPTION OF THE DRAWINGS

Embodiments of the invention will now be described in detail by way of example only with reference to the following drawings.

DETAILED DESCRIPTION OF A THE INVENTION

Figure 1:
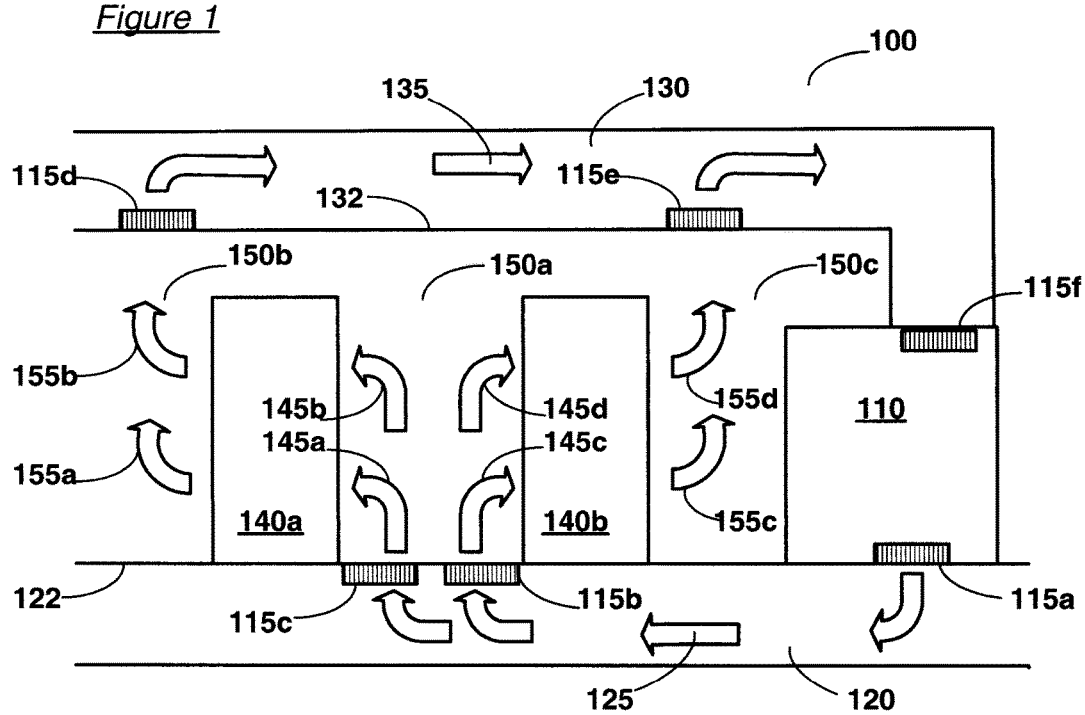
FIG. 1 is a cross-section of a prior art data center in which embodiments of the invention may be employed.

FIG. 1 illustrates a cross-section of a data center room 100 suitable for incorporating embodiments of the present invention. A conditioning unit, for example a computer room air conditioning unit (CRAC) 110, comprises chiller and blower components for, respectively, chilling and impelling fluid for circulating in the data center room. The circulating fluid functions for removal of heat generated by equipment operating in data center room 100. In an embodiment, the circulating fluid is a gaseous fluid, for example the fluid is the ambient air of data center room 100. In an embodiment, the CRAC 110 blows chilled air through a grille 115a into a sub-floor plenum chamber 120. The sub-floor plenum chamber 120 extends over substantially the whole floor area of data center room 100. The floor 122 is suitably supported above the sub-floor plenum chamber 120 to carry rows of equipment racks such as equipment racks 140a and 140b as illustrated. The equipment racks 140a, 140b each comprise a rack framework suitable for mounting modular data processing units, for example server computing units such as blade servers.

Air flows through the sub-floor plenum chamber 120 as shown by arrow 125. Air flows from the sub-floor plenum chamber 120 up through grilles 115b, 115c into a cold aisle 150a. From here air is drawn through the front of the racks 140a, 140b by air movers, such as fans, mounted within the racks 140a, 140b. The air flow 145a, 145b is shown entering the front of the rack 140a and the air flow 145c, 145d entering the front of the rack 140b. Air exits 155a, 155b from the rear of the rack 140a into a hot aisle 150b. Similarly, air exits 155c, 155d from the rear of the rack 140b into a hot aisle 150c. Air is then drawn upwards from the hot aisle 150b through a grille 115d in the roof 132 into a roof plenum chamber 130. Similarly, air is drawn upwards from the hot aisle 150c through a grille 115e in the roof 132 into the roof plenum chamber 130. The roof plenum chamber 130 extends over substantially the whole roof area of the data center room 100. Air flows 135 through the roof plenum chamber 130 and re-enters the CRAC 110 by way of a grille 115f.

Figure 2:
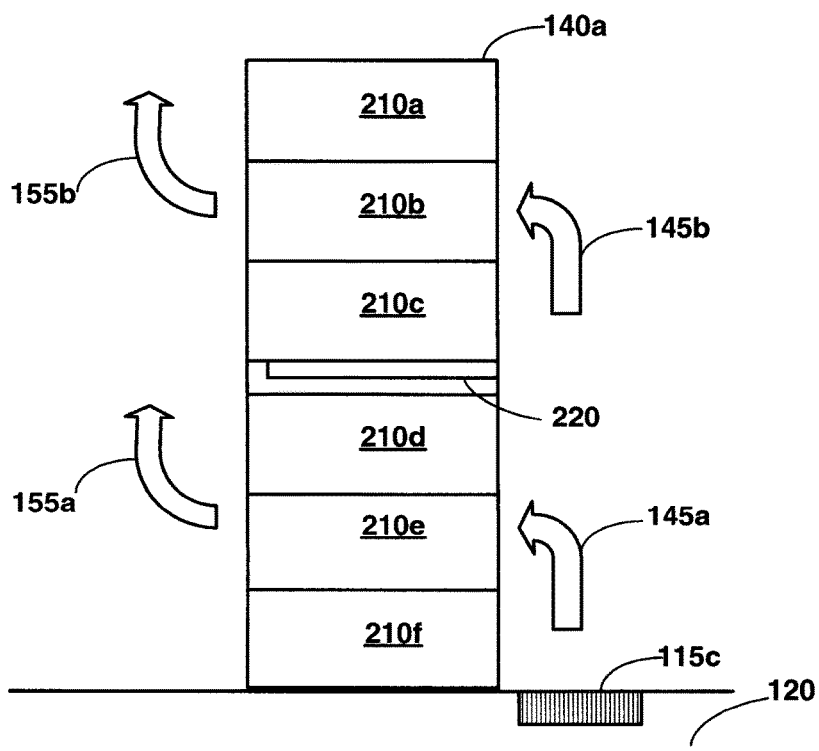
FIG. 2 is a cross-section of an equipment rack as illustrated in the data center of FIG. 1 in which embodiments of the invention may be employed.

FIG. 2 illustrates an enlarged cross-section of the rack 140a of FIG. 1. Air is shown rising through the grille 115c from the sub-floor plenum chamber 120. Air enters 145a, 145b the front of the rack 140a, drawn by air movers, such as fans, mounted within the rack 140a. Air exits 155a, 155b from the rear of the rack 140a. A typical arrangement of the rack 140a is shown in which the rack 140a is loaded with a plurality of substantially identical blade server units. The rack 140 is divided into vertical sections 210a to 210f. Each vertical section 210a to 210f comprises a plurality of vertically oriented blade servers each inserted on guide rails from front to back of the sections 210a to 210f. It will be understood that this is by way of example only. It will be understood that other arrangements are possible, for example using horizontally mounted data processing units mounted in the rack 140a, or a mix of horizontally and vertically mounted data processing units.

Also shown is a shelf unit 220 within the rack 140a. The shelf unit 220 comprises a substantially flat horizontal unit, typically extending across substantially the whole of the width of the rack 140a. The shelf unit 220 is mounted on rails attached to the framework of the rack 140a and is operable for withdrawing from the front of the rack 140a to provide a working surface for use by a human operator. The shelf unit 220 will therefore be mounted in the rack 140a, for example at a height suitable for allowing comfortable use by a human operator, for example in a standing position.

Figure 3A:
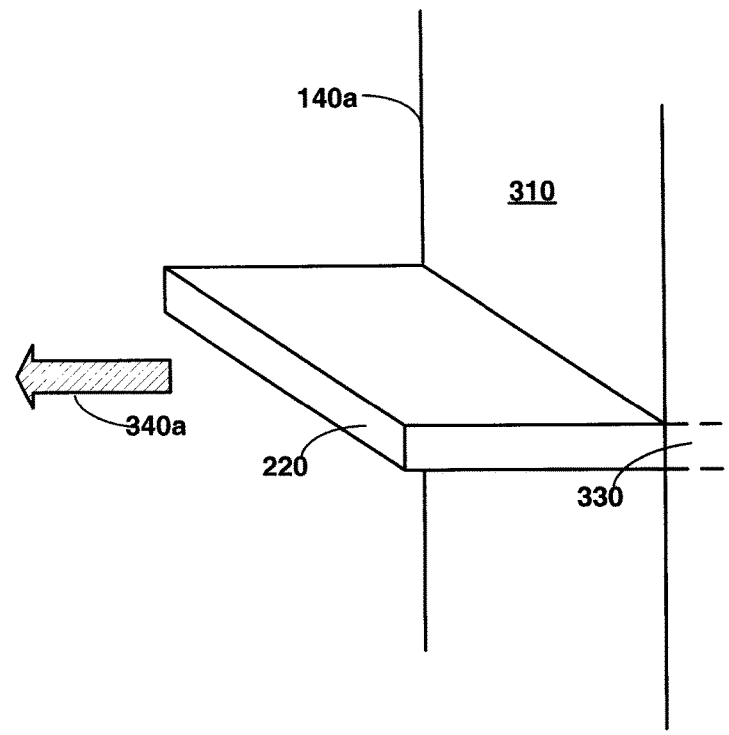
FIGS. 3a, 3b and 3c are perspective views illustrating the deployment of a hardware management console shelf according to the prior art.
Figure 3B:
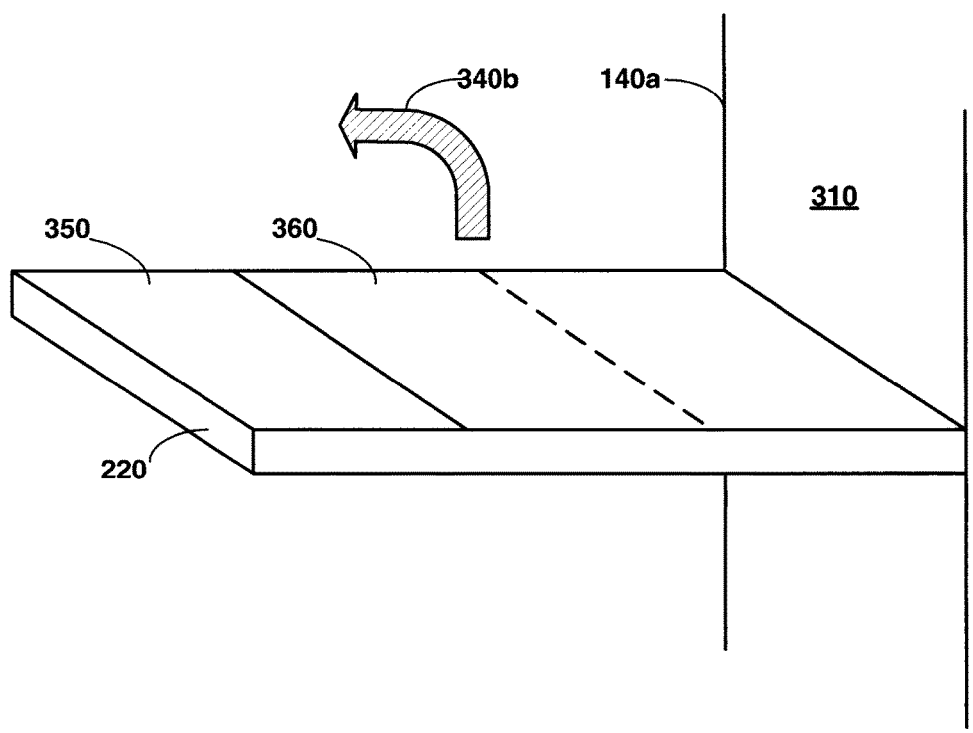
Figure 3C:
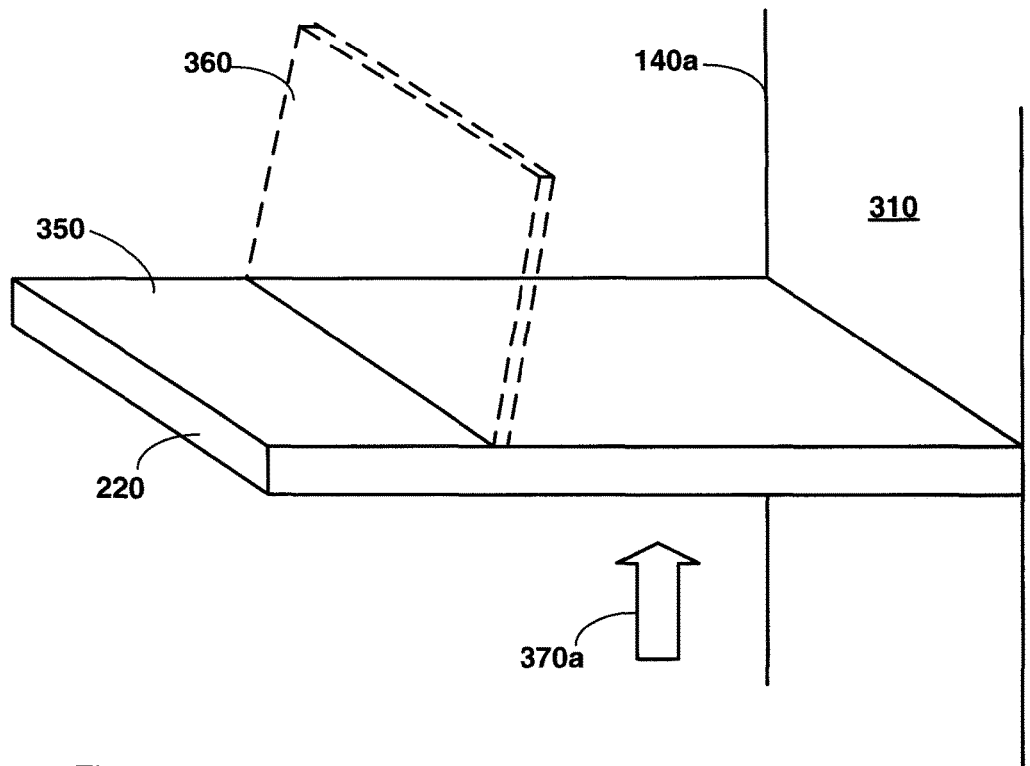

FIGS. 3a to 3c illustrate the deployment to an operating position of the shelf 220 suitable for incorporating embodiments of the present invention. In FIGS. 3a to 3c, the shelf unit 220 comprises a hardware management console, or HMC, which is an interface to a server unit installed for the purpose of allowing a human operator to perform hardware management operations on the other installed servers. In FIG. 3a, the shelf unit 220 runs on rails 330 in the rack 140a and is pulled out in direction 340a from the front 310 of the rack 140a. FIG. 3b shows the shelf unit 220 fully extended. The HMC has a keyboard 350 and a flat screen display 360. The screen 360 lies flat in a non-operational position as shown in FIG. 3b when the shelf 220 is extracted from the front 310 of the rack 140a. The screen 360 is raised to an operational position as shown by arrow 340b. FIG. 3c shows the shelf unit 220 with the HMC in an operational position. The shelf unit 220 provides a barrier to rising cool air 370a.

Figure 4:
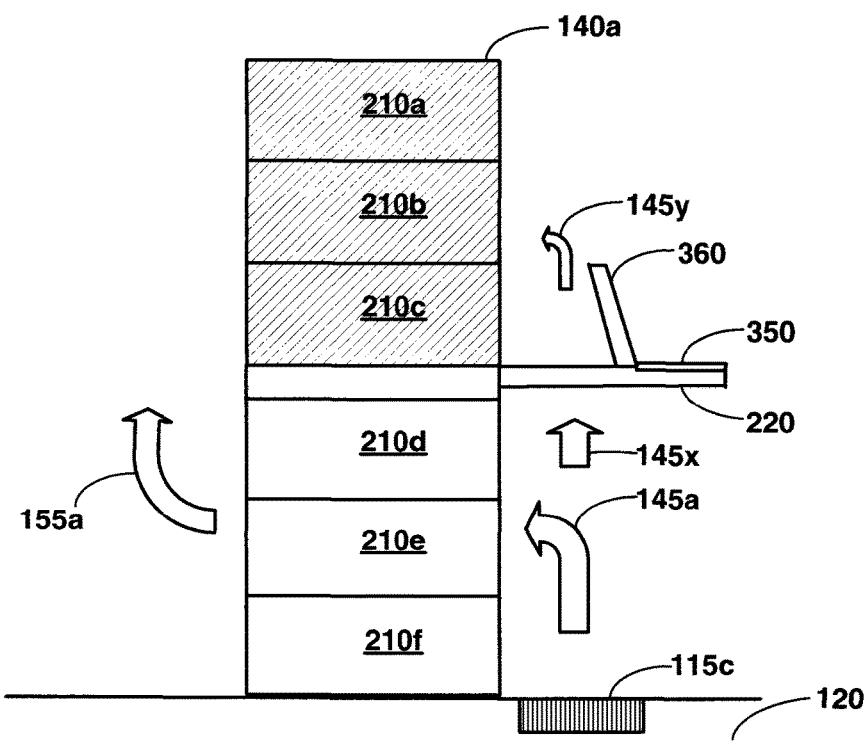
FIG. 4 is a cross section of a rack with a prior art hardware management console shelf deployed in its operational state.

FIG. 4 illustrates a cross-section of the rack 140a of FIG. 2, but comprising the shelf unit 220 in an operating position fully extended from the rack 140a. The shelf unit 220 comprises an HMC comprising the keyboard 350 and the display 360. Air 145a rises after passing through the grille 115c from the sub-floor plenum chamber 120. Air 145a enters the front of the rack 140a sections 210d to 210f and exits from the rear of the rack 140a from sections 210d to 210f. The shelf 220 presents a barrier to the rising cool air 145x. Consequently, the cool air flow 145y which may enter the front of the rack 140a at sections 210a to 210c is much reduced. Servers in the rack 140a sections 210a to 210c are therefore at risk of overheating.

Figure 5:
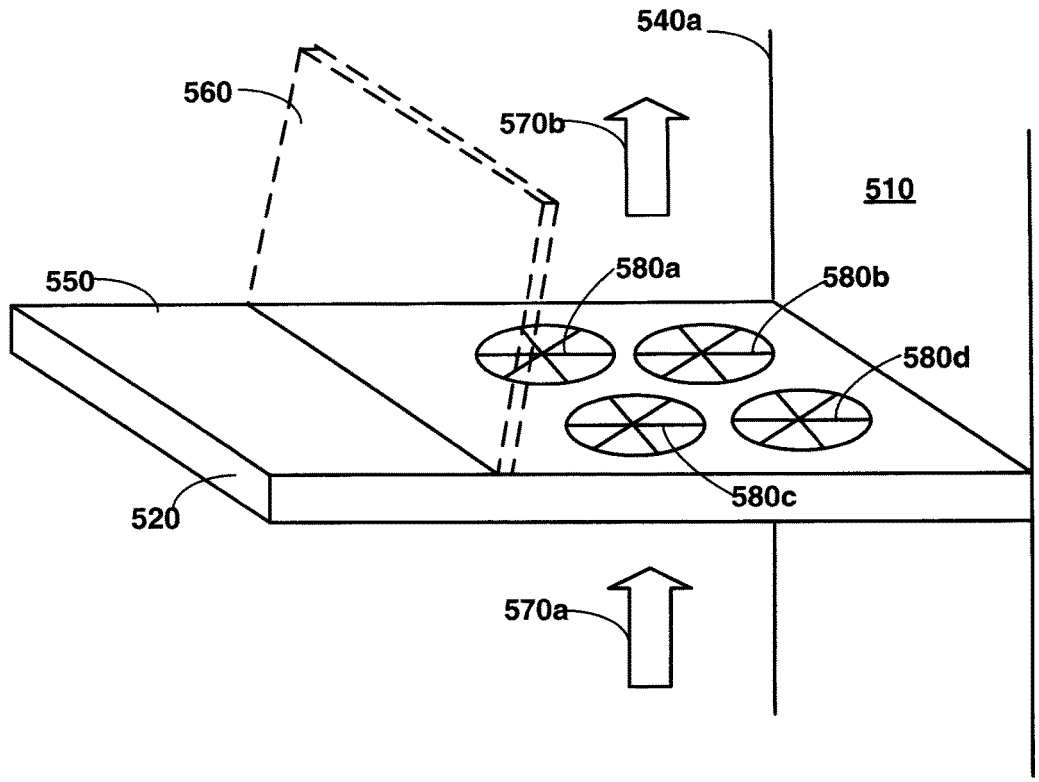
FIG. 5 is a perspective view illustrating an embodiment of the present invention.

FIG. 5 illustrates a shelf unit 520 extracted from the front 510 of a rack 540a according to an embodiment of the present invention. The shelf unit 520 comprises an HMC comprising a keyboard 550 and a display 560. The shelf unit 520 further comprises an aperture comprising a fluid mover. In an embodiment, the fluid mover comprises an air mover for moving air 570a from below the shelf unit 520 through the aperture in the shelf unit 520 and exiting 570b above the shelf unit 520. In the embodiment illustrated in FIG. 5, the air mover comprises fans 580a to 580d mounted within suitably shaped apertures in the shelf unit 520. The fans 580a to 580d may, for example, be mounted within the apertures in the shelf 520 and not protrude substantially from upper or lower surfaces of the shelf 520. The axes of rotation of the fan blades of the fans 580a to 580d may be orientated substantially vertically in relation to the rack 540a.

Figure 6:
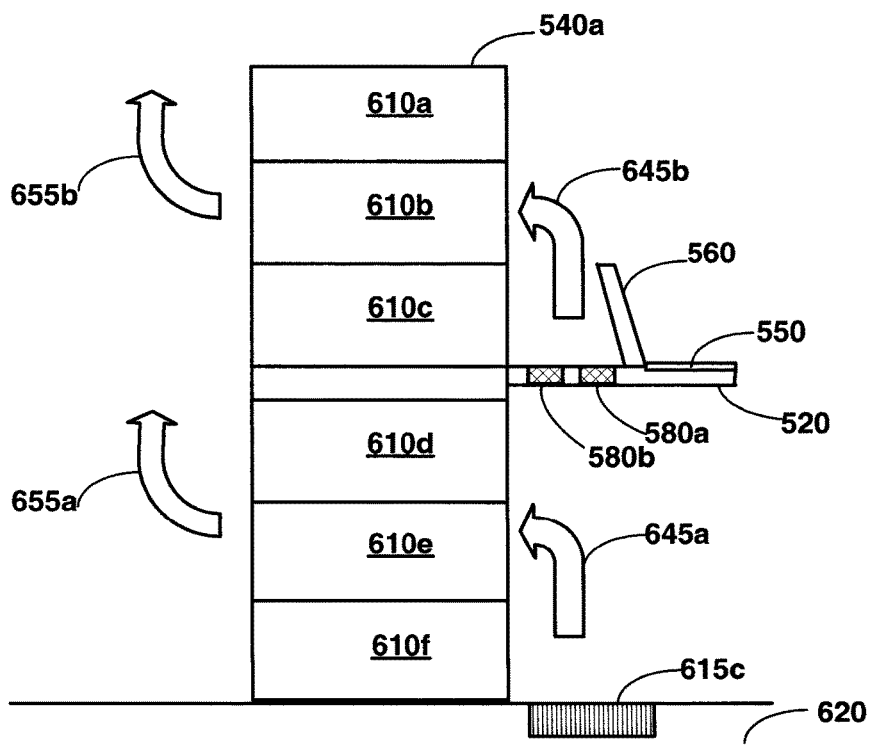
FIG. 6 is a cross-section of an equipment rack illustrating an embodiment of the present invention.

FIG. 6 illustrates a cross-section of the rack 540a comprising an embodiment of the present invention. The shelf 520 is shown extended in an operating position. The shelf 520 comprises an HMC comprising a keyboard 550 and a display 560. The shelf 520 comprises an aperture comprising a fluid mover, for example, an air mover. In the illustrated embodiment, the air mover comprises fans, 580a and 580b illustrated in cross-section. Air 645a rises through a grille 615c from a sub-floor plenum chamber 620 and enters the front of rack 540a. Air 645a passes over servers mounted in sections 610d to 610f of the rack 540a and exits 655a from the rear of the rack 540a. Air 645b is moved through the shelf 520 by the air mover, comprising fans 580a and 580b shown. Air 645b enters the front of the rack 540a and passes over servers mounted in sections 610a to 610c and exits 655b from the rear of the rack 540a. The shelf 520 therefore presents a reduced barrier to rising cooling air and servers in sections 610a to 610c receive an enhanced supply of cooling air so that the risk of overheating is reduced.

In a further embodiment with reference to FIG. 2, the shelf 220 comprises a simple shelf unit comprising an air mover in accordance with the present invention and does not comprise a HMC. In this embodiment it is possible to use the shelf unit to enhance the flow of cooling air.

It will be apparent that although embodiments of the invention have been described in relation to a data center comprising racks comprising a plurality of blade server computing units, other arrangements are possible without departing from the invention. In further embodiments of the invention, other types of data processing units are employed. In one exemplary embodiment, data processing units comprise horizontally mounted modular units. In another exemplary embodiment, the rack comprises a small number of larger data processing units. In a further embodiment, data processing units comprise data storage units such as magnetic or optical disk data storage units.

The invention claimed is:

1. A rack system, comprising:
   a shelf movable from a position internally of the rack system to a position externally of the rack system;
   wherein the shelf comprises:
      a hardware management console;
      at least one aperture extending completely through the shelf, wherein each aperture is located between the hardware management console and the rack system when the shelf is positioned externally of the rack system; and
      a fluid mover for moving fluid through each aperture in the shelf and into a front of the rack system when the shelf is located in the external position, such that the fluid moves over a set of servers mounted within the rack system above the shelf;
   wherein the fluid mover is configured to move the fluid perpendicular to the shelf through each aperture in the shelf only when the shelf is positioned externally of the rack system.

2. The rack system as claimed in claim 1, wherein the fluid mover is an air mover.

3. The rack system as claimed in claim 2, wherein the air mover is operable for moving air from below the shelf to above the shelf.

4. The rack system as claimed in claim 2, wherein the air mover comprises at least one fan.

5. The rack system as claimed in claim 1, wherein the shelf is mounted on rails operable for moving the shelf from the position internally of the rack system to the position externally of the rack system.

6. A shelf in a rack system, the shelf movable from a position internally of the rack system to a position externally of the rack system, the shelf comprising:
   a hardware management console;
   at least one aperture in the shelf adjacent the hardware management console, each aperture extending completely through the shelf; and
   a fluid mover for moving fluid through each aperture in the shelf and into a front of the rack system when the shelf is located in the external position, such that the fluid moves over a set of servers mounted in the rack system above the shelf,
   wherein the fluid mover is configured to move the fluid perpendicular to the shelf through each aperture in the shelf only when the shelf is positioned externally of the rack system.

7. The shelf as claimed in claim 6, wherein the fluid mover is an air mover.

8. The shelf as claimed in claim 7, wherein the air mover is operable for moving air from below the shelf to above the shelf.

9. The shelf as claimed in claim 7, wherein the air mover comprises at least one fan.

10. The shelf as claimed in claim 6, wherein the shelf is mounted on rails operable for moving the shelf from the position internally of the rack system to the position externally of the rack system.

11. A method for supplying cooling fluid to a rack system, comprising:
   selectively displacing a shelf between a position internally of the rack system to a position externally of the rack system, the shelf comprising a hardware management console and at least one aperture extending completely through the shelf; and
   moving fluid through each aperture in the shelf and into a front of the rack system when the shelf is located in the external position, each aperture adjacent the hardware management console and perpendicular to the shelf, such that the fluid moves over a set of servers mounted in the rack system above the shelf, wherein the fluid moves perpendicular to the shelf through each aperture in the shelf only when the shelf is positioned externally of the rack system.

12. The method as claimed in claim 11, wherein the fluid mover is an air mover.

13. The method as claimed in claim 12, wherein the air mover is operable for moving air from below the shelf to above the shelf.

14. The method as claimed in claim 12, wherein the air mover comprises at least one fan.

15. The method as claimed in claim 11, wherein the shelf is mounted on rails operable for moving the shelf from the position internally of the rack system to the position externally of the rack system.

* * * * *